United States Patent
Gupta

(10) Patent No.: US 11,187,753 B2
(45) Date of Patent: Nov. 30, 2021

(54) SYSTEM AND METHOD FOR DETERMINING A STATUS OF A VEHICLE BATTERY

(71) Applicant: Robert Bosch GmbH, Stuttgart (DE)

(72) Inventor: Sanghmitra Gupta, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 177 days.

(21) Appl. No.: 16/603,961

(22) PCT Filed: Mar. 6, 2018

(86) PCT No.: PCT/EP2018/055477
§ 371 (c)(1),
(2) Date: Oct. 9, 2019

(87) PCT Pub. No.: WO2018/188857
PCT Pub. Date: Oct. 18, 2018

(65) Prior Publication Data
US 2020/0158786 A1    May 21, 2020

(30) Foreign Application Priority Data
Apr. 10, 2017  (DE) .......................... 102017206071.9

(51) Int. Cl.
*G01R 31/00* (2006.01)
*G01R 31/3835* (2019.01)
(Continued)

(52) U.S. Cl.
CPC ..... *G01R 31/3835* (2019.01); *G01R 31/3646* (2019.01); *G01R 31/3647* (2019.01);
(Continued)

(58) Field of Classification Search
USPC .......................................... 324/426; 320/167
See application file for complete search history.

(56) References Cited

U.S. PATENT DOCUMENTS

| 2008/0150457 A1 | 6/2008 | Salman et al. |
| 2010/0026306 A1 | 2/2010 | Zhang et al. |
| (Continued) | | |

FOREIGN PATENT DOCUMENTS

| DE | 10297252 T5 | 9/2004 |
| DE | 10317524 A1 | 11/2004 |
| (Continued) | | |

OTHER PUBLICATIONS

International Search Report for PCT/EP2018/055477, dated Jul. 3, 2018.

*Primary Examiner* — Vincent Q Nguyen
(74) *Attorney, Agent, or Firm* — Norton Rose Fulbright US LLP; Gerard Messina

(57) ABSTRACT

A system and a method for determining a current and/or forecast state of a vehicle battery of a vehicle. The system includes an acquisition device which repeatedly acquires a respectively current idle state voltage value during at least one idle state of the vehicle when a prespecified idle state condition is met; a data storage device storing at least one voltage threshold value; an adaptation device which adapts the at least one voltage threshold value in the data storage device based on the acquired idle state voltage values; and a computing device that determines the current or forecast state of the vehicle battery based on a comparison of a provided comparison voltage value with at least the at least one adapted voltage threshold value, and issues an output signal that indicates the determined current and/or forecast state of the vehicle battery.

12 Claims, 4 Drawing Sheets

(51) Int. Cl.
*G01R 31/392* (2019.01)
*G01R 31/36* (2020.01)
*H01M 10/42* (2006.01)
*H01M 10/48* (2006.01)

(52) U.S. Cl.
CPC ...... *G01R 31/392* (2019.01); *H01M 10/4285* (2013.01); *H01M 10/48* (2013.01); *H01M 2220/20* (2013.01)

(56) References Cited

U.S. PATENT DOCUMENTS

| | | | |
|---|---|---|---|
| 2015/0178997 A1* | 6/2015 | Ohsaki | F02D 41/26 |
| | | | 701/29.1 |
| 2016/0231388 A1 | 8/2016 | Park | |
| 2016/0344206 A1* | 11/2016 | Ono | H02J 7/0031 |
| 2017/0269167 A1* | 9/2017 | Willey | G01R 31/382 |
| 2018/0326859 A1* | 11/2018 | Oh | B60L 11/1861 |

FOREIGN PATENT DOCUMENTS

| | | |
|---|---|---|
| DE | 10393251 T5 | 9/2005 |
| DE | 102007061130 A1 | 7/2008 |
| DE | 112009001806 T5 | 6/2011 |
| DE | 102013205692 A1 | 10/2014 |
| JP | 5028376 B2 | 9/2012 |
| JP | 2013191281 A | 9/2013 |
| WO | 2015136029 A2 | 9/2015 |

* cited by examiner

SYSTEM AND METHOD FOR DETERMINING A STATUS OF A VEHICLE BATTERY

FIELD

The present invention relates to a system and to a method for determining a state of a battery of a vehicle, in particular a starting capacity of the vehicle battery. The vehicle can be, in particular, a truck or a passenger vehicle. The vehicle battery can be, in particular, a start/stop automatic battery.

BACKGROUND INFORMATION

A vehicle battery, also referred to as an auto battery or a starter battery, is standardly an accumulator that can supply, inter alia, the electrical energy for a starter of an internal combustion engine. The internal combustion engine can be an internal combustion engine of a vehicle driven solely by the internal combustion engine. Alternatively, the internal combustion engine can also be an auxiliary engine of a vehicle that may be partly electrically driven, i.e., a hybrid vehicle.

Over time, vehicle batteries lose their charge, whether due to physical or chemical processes resulting from silent consumers in the vehicle, such as an anti-theft device or an engine block heater, or due to other effects. Here there is a danger that after a certain period of inactivity, a parked vehicle can no longer be started. In other words, it can happen that the vehicle battery no longer has starting capacity, so that the vehicle is no longer capable of being started.

German Patent Application No. DE 10 317 524 A1 describes a method and a device for predicting the starting capacity of a vehicle, determined based on a discharge current when the vehicle is shut off.

Moreover, PCT Application No. WO 2015/136029 A3 describes a telematics unit provided for retrofitting in a vehicle, for example using an OBD2 interface, that is configured or is configurable for a communication specific to the vehicle type via at least one vehicle bus of the vehicle, using a configuration modality of the telematics unit. In addition, this document describes a telematics system for acquiring vehicle data of the at least one vehicle via a wireless communication network.

An object of the present invention is to provide a further improved system and a method for determining the state of the vehicle battery.

SUMMARY

The present invention relates to a system and a method.

Correspondingly, an example system is provided for determining a current and/or forecast state of a battery of a vehicle, having: an acquisition device capable of acquiring a current voltage value of a voltage on board the vehicle originating from the battery of the vehicle; the acquisition device being set up repeatedly to acquire a current idle state voltage value during at least one idle state of the vehicle when a prespecified idle state condition is met, an engine of the vehicle being switched off in the idle state of the vehicle; a data storage device in which at least one voltage threshold value is stored; an adaptation device that is designed to adapt the at least one voltage threshold value in the data storage device based on the acquired idle state voltage values, only those acquired idle state voltage values being taken into account for the calculation of the voltage threshold values that meet a prespecified use condition; and a computing device that is designed to determine the current or forecast state of the vehicle battery based on a comparison of a provided comparison voltage value with at least the at least one voltage threshold value, and to issue an output signal that indicates the determined current and/or forecast state of the vehicle battery.

The acquisition device is preferably a telematics unit connected to an OBD interface of the vehicle, or is part of such a telematics unit. The telematics unit can for example be designed as described in PCT Application No. WO 2015/136029 A3.

References herein to a "voltage value" are to be understood as referring to a voltage value of the voltage on board the vehicle originating from the battery of the vehicle. This voltage can be, in particular, a voltage of a vehicle electrical network or a terminal voltage of the vehicle battery. The vehicle battery is preferably a battery having a nominal voltage of 12 V. The vehicle electrical network voltage can for example be outputted and acquired by an onboard computer, for example as a CAN value or an OBD-II standard diagnostic value, such as PID 42. The vehicle electrical network voltage can also be acquired by measurement at the vehicle (for example at the cable harness or at an OBD pin).

The statement that an acquired voltage value meets the use condition is to be understood as meaning that the numerical voltage value itself, and/or the circumstances in which the voltage value was acquired, e.g., the time at which the voltage value was acquired, meet the use condition. The use of the use condition has the result that only those acquired voltage values are taken into account for which there is a high probability that the vehicle battery was previously completely charged.

In addition, a method is provided for determining a current and/or forecast state of a battery of a vehicle, having the steps: provision of at least one voltage threshold value; multiple acquisition of a current idle state voltage value of a voltage on board the vehicle originating from the battery of the vehicle, during at least one idle state of the vehicle when a prespecified idle state condition is met, an engine of the vehicle being switched off in the idle state of the vehicle; adaptation of the voltage threshold value based on the acquired idle state voltage values, as well as optionally being based on the use behavior and/or driving behavior of the vehicle and/or on environmental factors, only those acquired idle state voltage values being taken into account that meet a prespecified use condition; acquisition of a current voltage value as comparison voltage value and/or prediction of an estimated voltage value as comparison voltage value; comparison of the comparison voltage value at least with the at least one voltage threshold value; determination of the current and/or forecast state of the vehicle battery based on a result of the comparison; and issuing an output signal that indicates the determined current and/or forecast state of the vehicle battery.

In accordance with the present invention, the state of the vehicle battery can be determined without using additional sensors, based only on a voltage, for example the vehicle electrical network voltage. Particularly advantageously, the use and driving behavior of the user of the vehicle, and/or environmental factors, are taken into account over a specified period of time, e.g., one day, so that threshold values can be dynamically adapted for the determination of the state of the vehicle battery. The use and driving behavior include for example kilometers traveled per trip, a maximum rotational speed that is reached, and/or elapsed times until discharge. The environmental factors may include for example an environmental temperature.

The system and the method for determining the current or forecast state of the vehicle battery can be used in a particularly versatile manner, because a large number of internal or external devices, for example mobile end devices, can be connected to the acquisition device in order to determine the current or forecast state of the vehicle battery. In the described manner, additional hardware components can be omitted, which can reduce the technical outlay, required processor power, and/or required processing time.

The adaptation of the stored voltage threshold values, based on voltage values measured in the idle state of the vehicle when the idle state condition is met, as well as, optionally, being based on a use and/or driving behavior of the vehicle and/or environmental factors, given use conditions that are met, enables a continuously more precise determination of the vehicle state that can be calibrated to a specific vehicle having a specific vehicle battery. Here, techniques of machine-based learning can be used. The use of the use condition brings it about that the adaptation of the stored voltage threshold values are based only on those measurements of current voltage values that are particularly relevant and reliable. For example, for the calculation of a floating average specifically for the vehicle based on idle voltage values, where there is a high probability that the vehicle battery is completely charged, in order to determine the state of the vehicle battery based thereon, this enables a determination of the state of the vehicle battery that is statistically particularly robust and as independent as possible of external influences.

The acquisition of the voltage values in the idle state of the vehicle also contributes to a particularly precise determination of the state of the vehicle battery. In the idle state of the vehicle, the probability that the battery has reached its idle voltage is particularly high.

Further specific embodiments and developments result from the description herein, with reference to the Figures.

According to a preferred development of the present invention, the acquisition device is designed or set up to provide the computing device with a current voltage value of the voltage on board the vehicle as the comparison voltage value. In this case, the computing devices can be designed or set up to determine the current state of the vehicle battery based on the comparison of the current voltage value, provided as the comparison voltage value, with the at least one adapted voltage threshold value, and to produce and issue the output signal in such a way that this signal indicates at least the determined current state of the vehicle battery. In this way, the current state of the vehicle battery can be determined for example upon request by a user via a request signal. In this way, for example a user of the vehicle can decide whether he or she now wishes to use this vehicle or, due to the low starting capacity of the vehicle battery as indicated by the output signal, would rather instead select a different vehicle or restore the starting capacity by external charging.

According to a further preferred development of the present invention, the system includes an estimating device that is designed or set up to estimate or predict at least one future voltage value of the voltage on board the vehicle as an estimated voltage value, and to provide the estimated voltage value to the computing device as a comparison voltage value. The estimated voltage value can be an estimated current voltage value, e.g., for the case in which no current voltage value has been communicated or made available to the computing device for a predetermined span of time.

Alternatively or in addition, the estimated voltage value can also be a forecast voltage value, which can also be designated a prognosis voltage value, which represents an estimation of the form that the voltage value may take at a future date. In this case, the computing device can in particular be designed or set up to determine at least the forecast state of the vehicle battery based on the comparison of the estimated voltage value, provided as comparison voltage value, with the at least one adapted voltage threshold value, and to issue an output signal that is made such that it indicates at least the forecast state of the vehicle battery.

The estimated voltage value can in addition be produced based on environmental factors, for example based on a current season of the year or a current date, and optionally additionally based on a geolocation of the vehicle. For example, in the winter a different estimated voltage value can be produced than in the summer, and average temperatures may be taken into account. This can be particularly advantageous in regions in which large temperature differences normally occur within a year, because the voltage drop of the vehicle battery at cold temperatures may be steeper than at warm temperatures.

Acquired voltage values that do not meet the use condition may also enter into the estimated voltage value. Such voltage values can be used in particular to ascertain a typical voltage drop per time period without charging the vehicle battery and/or without driving the vehicle.

In this way, a user can for example obtain an item of information concerning whether, if the vehicle continues to be parked in an existing situation, the vehicle battery will still have starting capacity or not after a specified number of days. In this way, the user can for example decide whether he or she wishes to park the vehicle, or leave the vehicle parked, for some days at a particular location, or whether afterwards there will be a danger that the vehicle battery will no longer have starting capacity, i.e., can no longer be started.

According to a further preferred development of the present invention, the acquisition device is capable of being connected, or is connected, to a diagnostic interface, e.g., an onboard diagnostic (OBD) interface, in particular an OBD-2 interface, of the vehicle, and is set up to acquire, at the diagnostic interface, a current voltage value of a vehicle electrical network voltage. In other words, the multiple acquisition of the respectively current idle state voltage value can take place at the diagnostic interface, the multiply acquired respectively current idle state voltage value being a voltage value for the voltage of the vehicle electrical network. The diagnostic interface is preferably an externally available interface.

Alternatively or in addition, the acquisition device can be set up to acquire a current voltage value of a terminal voltage of the vehicle battery directly at battery poles of the vehicle battery. In this way, the multiple acquisition of the respectively current idle state voltage value can take place at the poles of the vehicle battery, and the idle state voltage value can be a respective voltage value of the terminal voltage of the vehicle battery.

According to a further preferred development of the present invention, the output signal is in addition based on at least one of the following items of information:
  an item of information about a type of the vehicle battery;
  an item of information about a type of the vehicle;
  an item of information about a history of the vehicle;

an item of information about an equipping of the vehicle.

The information about the type of the vehicle battery can for example include that the vehicle battery is a Li-ion battery or is a lead-acid battery, in particular an EFB (enhanced flooded battery); optionally also an AGM (absorbent glass mat) battery. An AGM battery is an improved vehicle battery for motor vehicles having a start-stop system. Taking the type of the vehicle battery into account can enable a more precise prediction and/or a more precise determination of the state of the vehicle battery. For example, additional items of information can be ascertained and provided by the system, such as the fact that the level of an electrolyte liquid of the vehicle battery is low.

The item of information about the type of the vehicle can for example include information as to whether the vehicle is a compact car, a truck, or an SUV, what kind of engine it has, what kind of fuel it uses (e.g., diesel or gasoline), and the like. Based on this information, again a more precise determination of the current and/or forecast state of the vehicle battery can take place.

The information about the history of the vehicle can include in particular information about maintenance history and/or manufacturing history of the vehicle. For example, the year of manufacture of the vehicle, the year of the last battery change or installation of the vehicle battery, and the like, can be included in the information about the history of the vehicle. This information can contribute to enabling a more precise determination of the current or forecast state of the vehicle battery. For example, it can be taken into account that sulfation will more probably be present in a vehicle battery that is more than seven years old.

An item of information concerning an equipping of the vehicle is to be understood for example as information concerning technical equipment installed in the vehicle, such as seat heating, engine block heating, an anti-theft system, and the like. In addition, the information about the equipping of the vehicle can include information about the energy consumption of these devices in particular in the idle state of the vehicle. Based on this information, in particular a more precise forecast of the state of the vehicle battery can take place.

The current idle state voltage value is preferably always acquired precisely as soon as the engine of the vehicle is shut off, and in addition a prespecified idle state condition is simultaneously met. The idle state condition can ensure, or can increase the probability, that the vehicle battery has reached its idle voltage.

The at least one idle state condition can be or include one of the following conditions, or can be or include a combination of at least two of the following conditions:

since the last trip with the vehicle, at least one first prespecified period of time, for example six hours, has passed;

a prespecified or set clock time matches the current clock time;

no idle state voltage value was acquired during a past, second prespecified period of time, for example 24 hours.

The clock time can be statically defined (e.g., 2 AM). It can also be provided that the system has a geolocation device that provides a current geolocation of the vehicle, and that the clock time for the system is dynamically determined on the basis of the geolocation and/or other external factors.

According to a further advantageous development of the present invention, the prespecified use condition can be or include one of the following conditions, or can be or include a combination of at least two of the following conditions:

in a past, third prespecified period of time, for example 24 hours, the vehicle has traveled at least one prespecified distance, for example at least 50 km, such that it can be defined that kilometers traveled during a plurality of trips are counted together, or that only kilometers traveled within a single trip are to be taken into account;

in a past, fourth prespecified period of time, e.g., 24 hours, before the acquisition of the voltage value, within a single trip travel took place on a highway over at least one fifth prespecified period of time, e.g., one hour;

in a past, sixth prespecified period of time, e.g., 24 hours, before the acquisition of the voltage value, within a single trip travel took place with a rotational speed above a prespecified rotational speed threshold value, e.g., 3000 RPM, over at least one seventh prespecified period of time, e.g., 20 minutes.

According to a further preferred development of the present invention, the system includes a mobile and/or Internet-capable end device having an output device that is designed to produce a graphic, acoustic, and/or optical output based on the output signal. The system can be designed such that the data storage device, the adaptation device, and the computing device are installed in the vehicle, and that the output signal is communicated via a wired or wireless interface to the mobile end device, preferably to the output device of the mobile end device. It can also be provided that the data storage device, the adaptation device, and the computing device are integrated into the mobile and/or Internet-capable end device, e.g., computer, smart phone, or tablet). In addition, it can be provided that one, or some, of the data storage device, adaptation device, and computing device are integrated in the vehicle and that one, or some, of the data storage device, adaptation device, and computing device are integrated in a control device installed in the vehicle. The computing device and/or the adaptation device can also be realized in cloud-based fashion.

BRIEF DESCRIPTION OF THE DRAWINGS

The present invention is explained in more detail below on the basis of the exemplary embodiments shown in the schematic Figures.

In all the Figures, identical or functionally identical elements and devices have been provided with the same reference characters, unless otherwise indicated.

DETAILED DESCRIPTION OF EXAMPLE EMBODIMENTS

Figure 1:
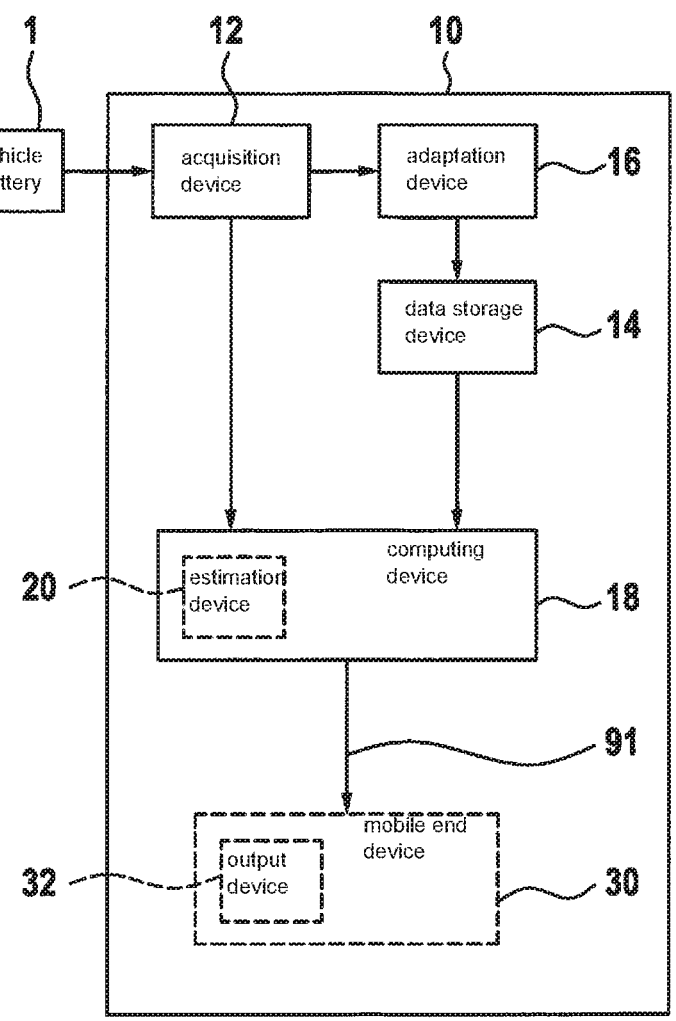
FIG. 1 shows a schematic diagram of a system for determining a state of a vehicle battery of a vehicle according to a specific embodiment of the present invention.

FIG. 1 shows a schematic diagram of a system 10 for determining a state of a vehicle battery 1 of a vehicle according to a specific embodiment of the present invention.

System 10 includes an acquisition device 12 capable of acquiring a current voltage value of a voltage on board the vehicle originating from vehicle battery 1 of the vehicle. This voltage can be in particular a voltage of a vehicle electrical network that can be picked off by acquisition device 12 for example at an OBD interface of the vehicle. The voltage can also be a terminal voltage picked off at battery poles of the vehicle battery 1 by acquisition device 12. Acquisition device 12 can be integrated, or can be capable of being integrated, in the vehicle. Acquisition device 12 can be realized as a telematics unit installed in the vehicle, or can be included in such a telematics unit. Acquisition device 12 can also be realized as a voltage-measuring circuit.

Acquisition device 12 is set up repeatedly to acquire a respective current idle state voltage value during at least one idle state of the vehicle, an engine of the vehicle being switched off in the idle state of the vehicle. Preferably, the idle state of the vehicle is a state in which the vehicle is parked and is not being used by the user. In an idle state of the vehicle, vehicle battery 1 can reach its idle voltage, on the basis of which the most precise determination of the state of the battery, in particular of its starting capacity, is possible. Standardly, a typical battery vehicle 1 requires approximately six hours after being used before it returns to its idle voltage.

Acquisition device 12 is designed to always acquire the current idle state voltage value precisely as soon as the engine of the vehicle is shut off, and in addition when at least one prespecified idle state condition is met. The idle state condition can be in particular one of the following conditions, or a combination of at least two of the following conditions, a) through c):

a) at least one first prespecified period of time, for example 6 hours, has passed since the end of the last trip with the vehicle (or since the last shutting off of the vehicle engine). This ensures that vehicle battery 1 has reached its idle voltage. Acquisition device 12 can be designed to receive a signal that indicates how much time has passed since the last trip with the vehicle, for example via a CAN bus of the vehicle. This increases the probability that vehicle battery 1 has reached its idle voltage.

b) a prespecified or set clock time matches the current clock time. Acquisition device 12 can have an internal clock for this purpose. The prespecified clock time can be for example between 1 AM and 5 AM, for example 2 AM. At such times, the probability is particularly high that the vehicle has not been in use for a long time, and vehicle battery 1 has therefore had time to reach its idle voltage. The clock time at which voltage values are to be acquired can also be set based on measurements at a clock time at which in the majority of cases, or with a probability above a prespecified minimum probability, the vehicle has not been driven for longer than a further prespecified period of time, e.g., longer than six hours.

c) no idle state voltage value has been acquired during a past, second prespecified period of time, for example 24 hours. This condition prevents multiple measurements from being carried out within, e.g., one day, which would give the state of vehicle battery 1 on this day an exaggerated weighting during a subsequent evaluation.

Moreover, system 10 includes a data storage device 14 in which at least one voltage threshold value, preferably a plurality of voltage threshold values, are stored. Data storage device 14 can be integrated in the vehicle. Preferably, the voltage threshold values are ascertained through the analysis of a large number of vehicles over a long period of time (e.g., 300 vehicles over a year), in order to ascertain patterns and statistical models and parameters, such as a median, a mean value, and a modal value (most frequently occurring value). The voltage threshold values can be defined based on one, a plurality, or all of these parameters.

For example, given an approximately normally distributed voltage curve of the ascertained voltages for the multiplicity of vehicles, a boundary line for a "healthy" vehicle battery 1 can be formed by the mean value. A battery in a "critical state" can be characterized by all values between the mean value and a value at "mean value minus three times the standard deviation." A systematic measurement error, which can be present for example in telematics units, can be avoided by such a dynamic definition of voltage threshold values.

In addition, system 10 includes an adaptation device 16 that is designed to adapt the voltage threshold value or values in data storage device 14 based on the acquired idle state voltage values.

Adaptation device 16 takes into account only those acquired voltage values that meet a prespecified use condition. The use condition is preferably based on the use characteristic and driving characteristic of the vehicle.

The use condition can be in particular one of the following conditions, or can be a combination of at least two of the following conditions d) through f):

d) in a past, third prespecified period of time, for example 24 hours, at least one prespecified distance was traveled with the vehicle, for example at least 50 km. In this way, it can be ensured, or the probability can be increased, that vehicle battery 1 is completely charged.

e) in a past, fourth prespecified period of time, e.g., 24 hours, before the acquisition of the voltage value, within a single trip travel took place on a highway and/or with a speed above a prespecified speed threshold value, e.g., above 90 km/h, 100 km/h, 110 km/h, or 120 km/h, over at least one fifth prespecified period of time, e.g., one hour. For this purpose, navigation data from a navigation device and/or a geolocation device and/or a data bus of the vehicle can be communicated to the adaptation device; here the navigation device and/or the geolocation device may be part of system 10.

f) in a past, sixth prespecified period of time, e.g., 24 hours, before the acquisition of the voltage value, within a single trip travel took place with a rotational speed above a prespecified rotational speed threshold value, e.g., 3000 RPM, over at least one seventh prespecified period of time, e.g., 20 minutes.

It can happen that measurement values are acquired, e.g., measured, at times at which the idle state condition is met, but the use condition is not met, and the measurement values measured at such times are correspondingly not taken into account by the further devices of system 10 and/or the further method steps. Alternatively, it can also be provided that no acquisition, e.g., no measurement, is carried out if the idle state condition is met but the use condition is not met.

Adaptation device 16 can be integrated in the vehicle. In this way, an idle voltage that is characteristic for a specific vehicle battery 1 can be taken into account. If the idle voltage of a specific vehicle battery 1 has decreased, for example relative to a nominal voltage of, e.g., 12 V, this can indicate a reduced starting capacity of the vehicle battery 1. If this lower value is slightly above one of the prespecified voltage threshold values, then a warning signal can be issued with corresponding frequency. Preferably, adaptation device 16 is realized as software that can be executed by a processor.

However, if this lower value of the idle voltage in this specific vehicle battery 1 remains constant over a prespecified fourth period of time (e.g., over two months), then adaptation device 16 can adapt the voltage threshold values in data storage device 14 so that the lower value of the idle voltage takes the place of the nominal voltage of 12 V, and all voltage threshold values are correspondingly adapted.

Adaptation device 16 can be designed so as to adapt the voltage threshold values based on a floating average of the current voltage values acquired by acquisition device 12 within the prespecified period of time, as soon as a prespecified time span has elapsed, for example as specified percentages of the floating average that may be greater than and/or less than 100%. One or more voltage threshold values can for example be defined as 120%, 100%, 100%, 95%, 90%, 85%, 80%, 60%, 50%, 40%, 20%, and/or 10% of the floating average. A set of voltage threshold values can for example include voltage threshold values of 110%, 90%, and 70%, or of 105%, 80%, and 60% of the floating average. As explained above, in the formation of the floating average only the acquired current voltage values are taken into account for which the use condition is met.

System 10 additionally contains a computing device 18 that is designed to determine the current or forecast state of vehicle battery 1 based on a comparison of a provided comparison voltage value with the prespecified voltage threshold values and/or with the adapted voltage threshold values, and to issue an output signal 91 that indicates the determined current or forecast state of vehicle battery 1. Computing device 18 can be integrated, or capable of being integrated, in the vehicle.

The comparison voltage value can be a current voltage value acquired by acquisition device 12. This can for example be the most recent voltage value, acquired according to the method described above, of the plurality of voltage values acquired during idle states of the vehicle.

System 10 can optionally be equipped with an estimating device 20 that is designed to predict at least one future voltage value as an estimated voltage value and to provide the predicted estimated voltage value to computing device 18 as the comparison voltage value. Estimation device 20 can be designed as part of computing device 18.

A specific system 10 can be set up such that only acquisition device 12 provides the comparison voltage value, or system 10 can include estimation device 20 and can be set up so that only estimation device 20 provides the comparison voltage value. However, it is also possible for a specific system 10 to be set up such that it has an estimation device 20 and that both estimation device 20 and also acquisition device 12 are capable of providing the comparison voltage value. Estimation device 20 can in particular be provided so as to provide the comparison voltage value when no current voltage value has been communicated to, or made available to, computing device 18 for a prespecified elapsed period of time (e.g., one day, two days, three days, or more).

Estimation device 20 can be designed so that it produces, or in other words estimates, the estimated voltage value by subtracting a voltage difference value per prespecified past time span from the last current voltage value received by computing device 18. For example, it can be provided that the voltage difference value is subtracted per each whole elapsed day (as prespecified elapsed time span); other time spans are also possible. The voltage difference value can have a fixed magnitude, for example between 0.01 V and 0.03 V, preferably 0.02 V.

The voltage difference value can also be a dynamically adapted voltage difference value. Preferably, a voltage difference value is used having a fixed magnitude, until a dynamically adapted voltage difference value has been produced on the basis of an adequate database (i.e., having a prespecified minimum number of data points). Computing device 18 can be set up to ascertain the voltage difference value from measurement data of a prespecified past period of time, for example the data of the last 14 days, the last 30 days, or the like. In particular, it can be provided that computing device 18 ascertains by what voltage difference value the currently measured voltage value has respectively decreased within the prespecified time span (e.g., one day). Preferably, only those time spans are taken into account in which the vehicle has not been driven.

System 10 can optionally have a mobile and/or Internet-capable end device 30 that includes an output device 32. Mobile end device 30 is preferably a smartphone or a computer. Output device 32 is designed or set up to receive output signal 91 and to produce a graphic, acoustic, and/or haptic output based on output signal 91. Correspondingly, output device 32 can have a screen (e.g., a touchscreen), a loudspeaker, and/or a vibrator. System 10 can in addition also include the vehicle with the vehicle battery.

Data storage device 14, adaptation device 16, and/or computing device 18 can be integrated in mobile end device 30.

Figure 2:
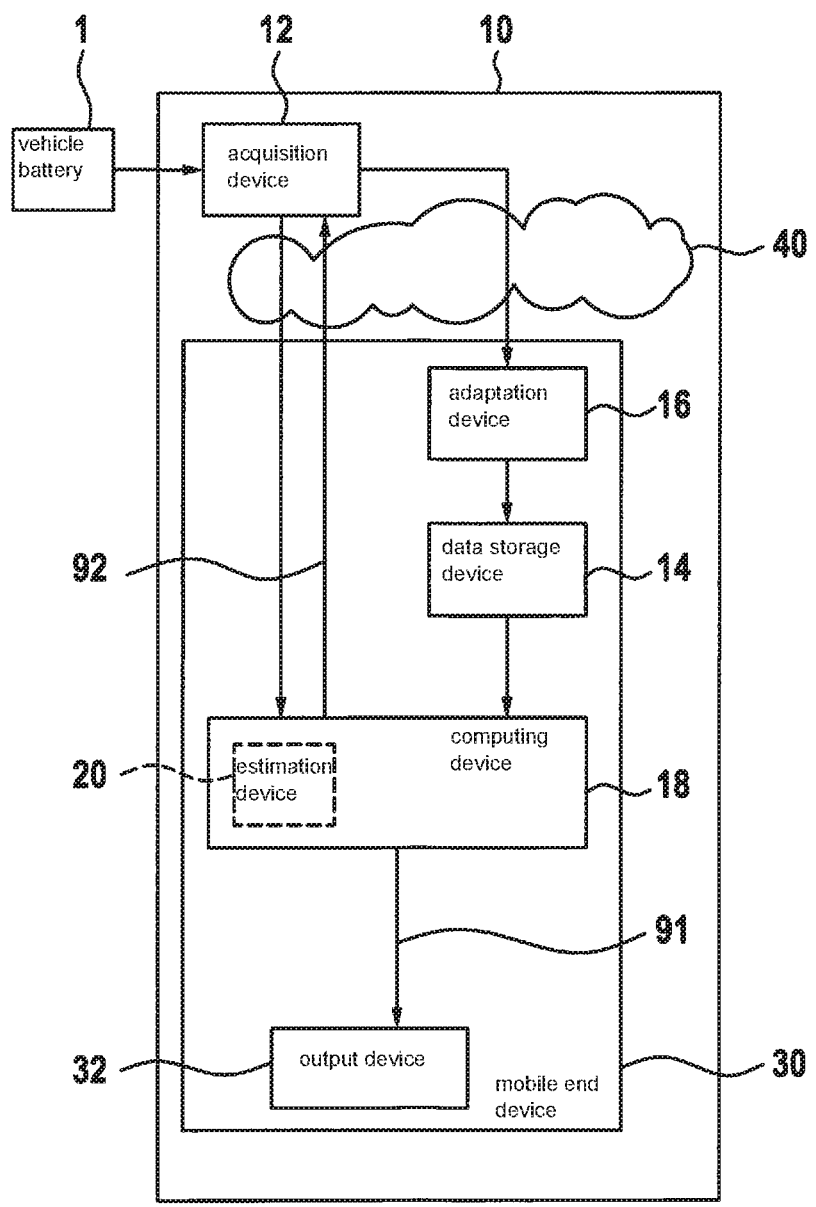
FIG. 2 shows a schematic diagram of a system according to a variant of the system of FIG. 1.

The schematic diagram of FIG. 2 shows a system 10 according to a specific embodiment in which data storage device 14, adaptation device 16, and computing device 18 are integrated in mobile end device 30.

Mobile end device 30 can have a processor and a data storage unit, adaptation device 16 and/or computing device 18 being realized by software (e.g., an app) that is stored in the data storage device and is executed by the processor. Data storage device 14 can be integrated in the data storage device of mobile end device 30.

If the comparison voltage value is provided by acquisition device 12, which is integrated in the vehicle, then the comparison voltage value can be communicated in wirebound fashion, but preferably wirelessly, from acquisition device 12 to mobile end device 30, for example via at least one server 40 (e.g., a server cloud), which can be part of system 10. All signals communicated to mobile end device 30 by acquisition device 12 can be communicated from a first, preferably wireless, communication interface of acquisition device 12 to a second, preferably wireless, communication interface of mobile end device 30.

Mobile end device 30 can be designed or set up (e.g., through corresponding programming of the app mentioned above) such that, in reaction to a user input, a request signal 92 is produced (e.g., by computing device 18) and is communicated to acquisition device 12, e.g., via the server cloud and/or the at least one server 40. Acquisition device 12 can be set up to acquire the current voltage value in reaction to request signal 92, and to communicate this voltage value to computing device 18 as the comparison voltage value. In this way, based on the correspondingly produced and issued output signal 91, the user can obtain a current item of information about the current state of vehicle battery 1, for example concerning a starting capacity.

This current item of information about the starting capacity of the vehicle battery 1 can be presented for example in the manner of a stoplight (red: "not capable of starting"; yellow: "difficulties may occur when starting the vehicle battery"; green: "capable of starting") or the like, where each color corresponds to a voltage range defined by the voltage threshold values.

Mobile end device 30 can be designed or set up (e.g., through corresponding programming of the app mentioned above) such that the user can indicate a date in the future, e.g., by inputting the date, or a number of days, hours, etc. from the current time, whereupon estimation device 20 predicts, based on the indicated date, a voltage value of the voltage on board the vehicle as an estimated voltage value and provides this estimated voltage value to computing device 18, and computing device 18 produces output signal 91 based on this estimated voltage value.

If the user is planning a longer trip, for example in 10 days, he or she can indicate this time period and, based on the output signal 91 correspondingly produced by output device 32, can obtain an item of information about the forecast state of vehicle battery 1. For example, it can be forecast that in 10 days vehicle battery 1 will not be capable of starting.

Optionally, in addition, as described above, the current state of vehicle battery 1 can be determined and an item of information about it can be issued to output device 32. For example, the user could receive an item of information stating that vehicle battery 1 is currently capable of starting.

Estimation device 20 can also be designed or set up to forecast up to what day vehicle battery 1 will be capable of starting, based on the voltage threshold values in data storage device 14. In this way, via output device 30 to the user can be given an item of information as to when he or she, at the latest, has to use the vehicle again in order to keep vehicle battery 1 in a condition capable of starting. Mobile end device 30 can be designed to give the user concrete instructions about this based on the current voltage value, such as the minimum number of kilometers he or she should travel with the vehicle and the like.

Figure 3:
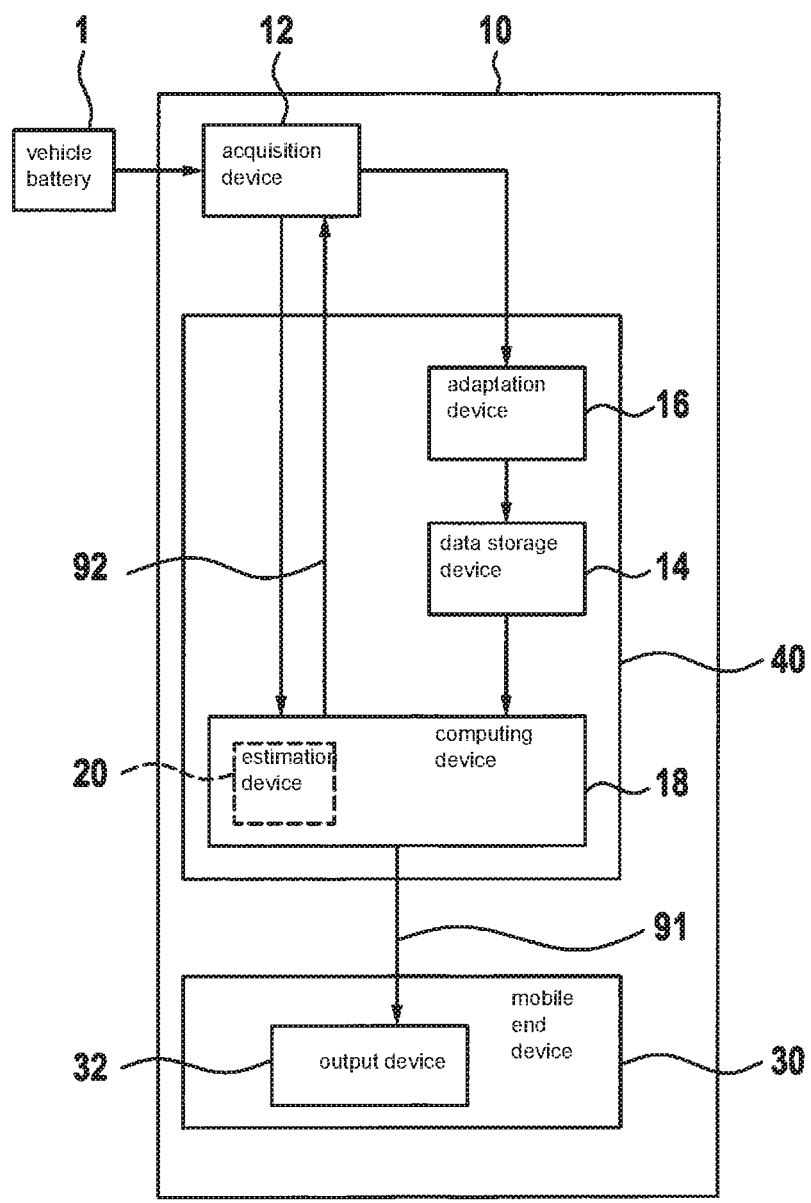
FIG. 3 shows a schematic diagram of a system according to a further variant of the system of FIG. 1.

FIG. 3 shows a schematic diagram of a system 10 according to a further variant of system 10 of FIG. 1. In the system shown in FIG. 3, data storage device 14, adaptation device 16, and computing device 18 (optionally with estimation device 20) are realized by at least one server 40, e.g., in cloud-based fashion. Acquisition device 12 is advantageously realized as a telematics unit or as part of a telematics unit that is installed in the vehicle. Acquisition device 12 or the telematics unit can have a wireless communication interface, e.g., a mobile radiotelephone interface, or can be connected to such an interface, via which data are capable of being communicated, and are communicated, from acquisition device 12 to server 40 for processing by adaptation device 16 and computing device 18. Acquisition device 12 or the telematics unit can for example have a mobile radiotelephone SIM card for this purpose.

If the vehicle is parked for example in an underground garage, it can happen that, due to a shielding of the mobile radiotelephone network in the underground garage, acquisition device 12 cannot communicate currently acquired voltage values to server 40. In this case, as described above, it can be provided that estimation device 20 of computing device 18 provides an estimated current voltage value (or estimated voltage value) as the comparison voltage value.

Figure 4:
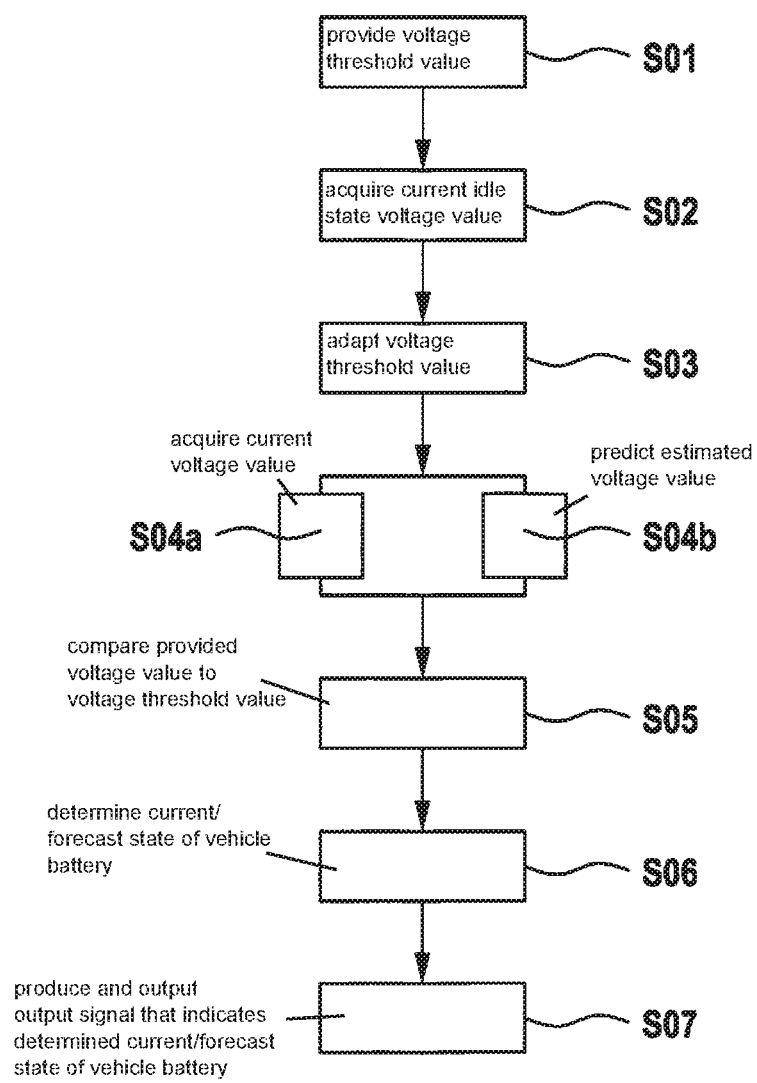
FIG. 4 shows a schematic flow diagram explaining a further specific embodiment of the present invention.

FIG. 4 shows a schematic flow diagram for the explanation of a method for determining a current and/or a forecast state of a vehicle battery. The method according to FIG. 4 can be carried out by the system according to the present invention and can be adapted in accordance with all variants and modifications described with reference to the system according to the present invention, and vice versa.

In a step S01, at least one voltage threshold value is provided, for example as described above with reference to data storage device 14. Preferably, a plurality of a voltage threshold values are provided, for example relative to a vehicle battery 1 having a nominal voltage of 12 V:

12.1 V to 12.3 V: vehicle battery in good condition;
11.9 V to 12.1 V: vehicle battery in acceptable condition;
11.5 V to 11.9 V: vehicle battery in critical condition; and
below 11.5 V: vehicle battery not capable of starting.

Alternatively, relative to a maximum voltage of a vehicle battery 1 that was just manufactured or just installed in the vehicle, the voltage threshold values can be provided as percentages of the maximum voltage.

In a plurality of steps S02, a respectively current idle state voltage value of a voltage on board the vehicle originating from battery 1 of the vehicle is acquired during at least one idle state of the vehicle if, preferably exactly when, a prespecified idle state condition is met, an engine of the vehicle being switched off in the idle state of the vehicle. The respective acquisition S02 can for example take place, and the idle state condition can be selected, as described above with reference to acquisition device 12.

In a step S03, there takes place an adaptation of the at least one voltage threshold value based on the acquired idle state voltage values, such that in adaptation S03 only those acquired idle state voltage values are taken into account that meet a prespecified use condition, for example as described above with reference to adaptation device 16 and the possible use conditions described there.

In a step S04a, a current voltage value is acquired and is provided as a comparison voltage value, for example as described above with reference to acquisition device 12. In a step S04b, alternatively or in addition to step S04a, an estimated voltage value is predicted, for example as described above with reference to estimation device 20, and is provided as comparison voltage value.

In a step S05, the provided comparison voltage value is compared to the at least one voltage threshold value. In particular, for the comparison S05, the at least one originally provided voltage threshold value is used as long as (and particularly preferably only as long as), in steps S02, a prespecified number of idle state voltage values (e.g., 10, 20, 30, or 60) were not acquired and/or taken into account according to the use condition. In this way, it can be ensured that the at least one prespecified voltage threshold value is not replaced by the at least one adapted voltage threshold value until the adaptation S03 is based on an adequate database.

In a step S06, the current and/or forecast state of the vehicle battery is determined based on a result of the comparison, for example as described above with reference to computing device 18.

In a step S07, an output signal 91 is produced and outputted that indicates the determined current and/or forecast state of vehicle battery 1.

Output signal 91 can be further processed for example as described above with reference to FIGS. 1 and 2, for example by a mobile end device 30. In addition, a request signal 92 can be produced and processed, as explained with reference to FIG. 2.

Although the present invention has been described above on the basis of preferred exemplary embodiments, it is not limited thereto, but rather can be modified in many ways. In particular, the present invention can be modified in many ways without departing from the core of the present invention.

Computing device 18 can for example in addition be set up to evaluate the acquired voltage values, in order to determine whether the idle voltage of vehicle battery 1 after a trip, or after a prespecified number of trips, greater than a prespecified minimum distance (e.g., 50 km) assumes voltage values above a prespecified voltage threshold value, e.g., above a nominal voltage of the vehicle battery, for example 12 V. If this is not the case, or if it is not the case for at least a prespecified number of such trips above the prespecified minimum distance, then computing device 18 can infer therefrom a sulfation, i.e., aging, or some other defect of vehicle battery 1, and can correspondingly produce output signal 91 in such a way that output signal 91 indicates that vehicle battery 1 should be exchanged.

In addition, computing device 18 can be set up to acquire the information that the idle voltage of vehicle battery 1 does indeed increase beyond a prespecified voltage threshold after a trip exceeding the prespecified minimum distance, but that the idle voltage then again decreases below this voltage threshold value, or below a lower voltage threshold value, within a prespecified time span. In this case, computing device 18 can be set up so as to produce output signal 91 in such a way that output signal 91 indicates that vehicle battery 1 is not capable of holding the voltage, and has to be repaired or exchanged. In this way, in particular an aging of the battery can be determined.

Output signal 91 can be enriched with additional information, for example tips for better care of the vehicle battery, an analysis of driving behavior and/or a correlation with environmental factors, proposals for a battery change and/or repair, and the like. The output signal can cause data to be stored in a database, available to service providers such as repair shops, battery manufacturers, replacement parts suppliers, fleet operators, roadside assistance providers, insurance companies, etc., for further data processing.

What is claimed is:

1. A system for determining a current state and/or a forecast state of a vehicle battery of a vehicle, comprising:
    an acquisition device configured to acquire a current voltage value of a voltage on board the vehicle originating from the vehicle battery, the acquisition device configured to repeatedly acquire a respectively current idle state voltage value during at least one idle state of the vehicle when a prespecified idle state condition is met, an engine of the vehicle being switched off in the idle state of the vehicle;
    a data storage device in which at least one voltage threshold value is stored;
    an adaptation device configured to adapt the at least one voltage threshold value in the data storage device based on the acquired idle state voltage values, only those idle state voltage values being taken into account that meet a prespecified use condition; and
    a computing device configured to determine the current state or the forecast state of the vehicle battery based on a comparison of a provided comparison voltage value with at least the at least one voltage threshold value, and to issue an output signal that indicates the determined current state and/or determined forecast state of the vehicle battery.

2. The system as recited in claim 1, wherein the acquisition device is configured to provide a current voltage value to the computing device as the comparison voltage value.

3. The system as recited in claim 1, further comprising:
    an estimation device configured to predict at least one future voltage value as an estimated voltage value, and to provide the estimated voltage value to the computing device as the comparison voltage value.

4. The system as recited in claim 1, wherein:
    the acquisition device is capable of being connected, or is connected, to a diagnostic interface of the vehicle, and is configured to acquire, at the on-board diagnostic interface, a current voltage value of a voltage of the vehicle electrical network; and/or
    the acquisition device is configured to acquire a current voltage value of a terminal voltage of the vehicle battery directly at battery poles of the vehicle battery.

5. The system as recited in claim 1, wherein the output signal is based on at least one of the following items of information:
    an item of information about a battery type of the vehicle battery;
    an item of information about a vehicle type of the vehicle;
    an item of information about a history of the vehicle;
    an item of information about an equipping of the vehicle.

6. The system as recited in claim 1, wherein the prespecified idle state condition includes at least one of the following conditions:
    since an end of a last trip with the vehicle, at least one first prespecified period of time has passed;
    a prespecified or set clock time matches a current clock time;
    no idle state voltage value was acquired during a past, second prespecified period of time.

7. The system as recited in claim 1, wherein the prespecified use condition includes at least one of the following conditions:
    in a past, third prespecified period of time before the acquisition of the voltage value, the vehicle traveled at least one prespecified distance;
    in a past, fourth prespecified period of time before the acquisition of the voltage value, within a single trip travel took place over at least one fifth prespecified period of time at a speed above a prespecified speed threshold value;
    in a past, sixth prespecified period of time before the acquisition of the voltage value, within a single trip, travel took place over at least one seventh prespecified period of time with a rotational speed above a prespecified rotational speed threshold value.

8. The system as recited in claim 1, further comprising:
    a mobile and/or Internet-capable end device having an output device that is configured to produce, based on the output signal, a graphic, acoustic, and/or haptic output.

9. The system as recited in claim 1, wherein the computing device is configured to evaluate the acquired voltage values to determine whether the idle voltage of the vehicle battery, after a trip or after a prespecified number of trips of the vehicle greater than a prespecified minimum distance, assumes voltage values above a prespecified voltage threshold value, wherein if the idle voltage of the vehicle battery does not assume voltage values above the prespecified voltage threshold value, or if the idle voltage of the vehicle battery does not assume voltage values above the prespecified voltage threshold value for at least a prespecified number of such trips larger than the prespecified minimum distance, the computing device is configured to infer a defect of the vehicle battery, and to produce the output signal in such a way that the output signal indicates that the vehicle battery is to be exchanged.

10. A method for determining a current state and/or a forecast state of a vehicle battery of a vehicle, comprising the following steps:
    providing at least one voltage threshold value;
    multiple acquiring of a respectively current idle state voltage value of a voltage on board the vehicle originating from the vehicle battery of the vehicle, during at least one idle state of the vehicle, when a prespecified idle state condition is met, an engine of the vehicle being switched off in the idle state of the vehicle;

adapting the voltage threshold value based on the acquired idle state voltage values, only those acquired idle state voltage values being taken into account that meet a prespecified use condition;

acquiring a current voltage value as a comparison voltage value, and/or a prediction of an estimated voltage value as the comparison voltage value;

comparing the comparison voltage value with at least the at least one voltage threshold value;

determining the current state and/or the forecast state of the vehicle battery based on a result of the comparison; and issuing an output signal that indicates the determined current state and/or the determined forecast state of the vehicle battery.

11. The method as recited in claim 10, wherein the prespecified idle state condition includes at least one the following conditions:

at least one first prespecified period of time has passed since an end of the last trip with the vehicle;

a prespecified or set clock time matches a current clock time;

no idle state voltage value was acquired during a past, second prespecified period of time.

12. The method as recited in claim 10, the prespecified use condition including at least one of the following conditions:

in a past, third prespecified period of time at least one prespecified distance was traveled with the vehicle;

in a past, fourth prespecified period of time before the acquisition of the voltage value, within a single trip travel took place over at least one fifth prespecified period of time with a speed above a prespecified speed threshold value;

in a past, sixth prespecified period of time before the acquisition of the voltage value, within a single trip travel took place over at least one seventh prespecified period of time with a rotational speed above a prespecified rotational speed threshold value.

\* \* \* \* \*